(12) United States Patent
Trivedi et al.

(10) Patent No.: US 12,089,411 B2
(45) Date of Patent: Sep. 10, 2024

(54) SELF-ALIGNED FRONT-END CHARGE TRAP FLASH MEMORY CELL AND CAPACITOR DESIGN FOR INTEGRATED HIGH-DENSITY SCALED DEVICES

(71) Applicant: Intel Corporation, Santa Clara, CA (US)

(72) Inventors: Tanuj Trivedi, Hillsboro, OR (US); Walid M. Hafez, Portland, OR (US); Rohan Bambery, Hillsboro, OR (US); Daniel B. O'Brien, Beaverton, OR (US); Christopher Alan Nolph, Hillsboro, OR (US); Rahul Ramaswamy, Portland, OR (US); Ting Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 932 days.

(21) Appl. No.: 16/910,020

(22) Filed: Jun. 23, 2020

(65) Prior Publication Data

US 2021/0399002 A1    Dec. 23, 2021

(51) Int. Cl.
*H01L 29/78* (2006.01)
*H01L 21/28* (2006.01)
(Continued)

(52) U.S. Cl.
CPC ............. *H10B 43/30* (2023.02); *H01L 28/60* (2013.01); *H01L 29/40117* (2019.08);
(Continued)

(58) Field of Classification Search
CPC ........ H10B 43/30; H10B 41/41; H10B 41/70; H10B 41/35; H10B 43/35; H10B 43/40; H10B 43/50; H10B 12/00–50; H10B 12/10; H10B 20/00–10; H10B 20/27–50; H01L 28/60; H01L 29/40117; H01L 29/66795; H01L 29/66833; H01L 29/7851;
(Continued)

(56) References Cited

U.S. PATENT DOCUMENTS

| | | | |
|---|---|---|---|
| 2007/0108529 A1* | 5/2007 | Huang | ............ H01L 21/823807 257/E21.633 |
| 2015/0145066 A1* | 5/2015 | Lu | ..................... H01L 29/66795 438/283 |

(Continued)

*Primary Examiner* — Shahed Ahmed
(74) *Attorney, Agent, or Firm* — Schwabe, Williamson & Wyatt P.C.

(57) ABSTRACT

Embodiments disclosed herein include a semiconductor device and methods of forming such a device. In an embodiment, the semiconductor device comprises a substrate and a transistor on the substrate. In an embodiment, the transistor comprises a first gate electrode, where the first gate electrode is part of a first array of gate electrodes with a first pitch. In an embodiment, the first gate electrode has a first average grain size. In an embodiment, the semiconductor device further comprises a component cell on the substrate. In an embodiment, the component cell comprises a second gate electrode, where the second gate electrode is part of a second array of gate electrodes with a second pitch that is larger than the first pitch. In an embodiment, the second gate electrode has a second average grain size that is larger than the first average grain size.

14 Claims, 14 Drawing Sheets

(51) Int. Cl.
*H01L 29/66* (2006.01)
*H01L 29/792* (2006.01)
*H01L 49/02* (2006.01)
*H10B 43/30* (2023.01)

(52) U.S. Cl.
CPC .. *H01L 29/66795* (2013.01); *H01L 29/66833* (2013.01); *H01L 29/7851* (2013.01); *H01L 29/792* (2013.01)

(58) Field of Classification Search
CPC ............... H01L 29/792; H01L 27/0886; H01L 29/40114; H01L 29/788; H01L 21/322–3228; H01L 29/04–045; G11C 11/401–4099
See application file for complete search history.

(56) References Cited

U.S. PATENT DOCUMENTS

2018/0342417 A1* 11/2018 Lee ................... H01L 21/76829
2021/0305386 A1* 9/2021 Hsiao ................. H01L 27/0207

* cited by examiner

SELF-ALIGNED FRONT-END CHARGE TRAP FLASH MEMORY CELL AND CAPACITOR DESIGN FOR INTEGRATED HIGH-DENSITY SCALED DEVICES

TECHNICAL FIELD

Embodiments of the present disclosure relate to semiconductor devices, and more particularly to charge trap flash (CTF) memory cells and metal-insulator-metal (MIM) capacitor architectures that are enabled by selective metal plating based on gate pitch.

BACKGROUND

Charge trap flash (CTF) memory cells are becoming more common. However, the fabrication of CTF memory cells require extra mask and lithography steps in addition to large area patterning in order to integrate such cells with standard logic and SRAM devices. Accordingly, the CTF memory cells are expensive and prone to manufacturing defects, such as overlay errors and the like.

EMBODIMENTS OF THE PRESENT DISCLOSURE

Figure 1A:
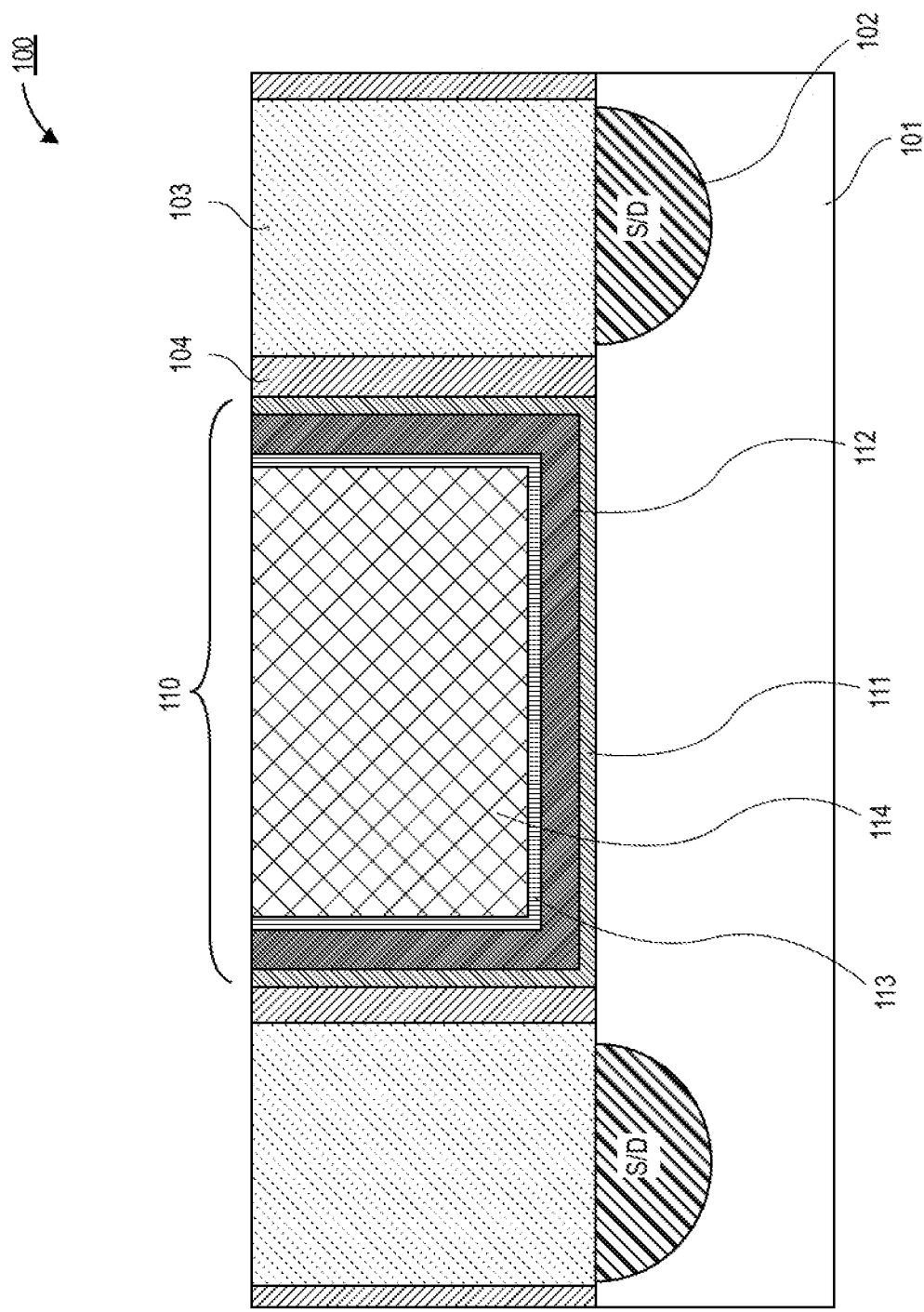
FIG. 1A is a cross-sectional illustration of a charge trap flash (CTF) memory cell, in accordance with an embodiment.

Described herein are charge trap flash (CTF) memory cells and metal-insulator-metal (MIM) capacitor architectures that are enabled by selective metal plating based on gate pitch, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, charge trap flash (CTF) memory cells currently require additional patterning operations to fabricate. This leads to greater expense of such components. Accordingly, embodiments disclosed herein include CTF memory cells that are self-aligned and fabricated in parallel with other transistor devices. As such, the cost of such devices is reduced, and overlay error is no longer a problem. In addition to CTF memory cells, similar processing operations may be used to provide self-aligned front end capacitors. Particularly, the capacitors may be metal-insulator-metal (MIM) capacitors. Such capacitors are typically back end of line (BEOL) devices. Accordingly, the MIM capacitors disclosed herein are able to utilize alternative material sets typically reserved for front end of line (FEOL) process. This allows for enhanced abilities to tune the MIM capacitors.

Embodiments disclosed herein leverage a tungsten nucleation poisoning process in order to selectively deposit tungsten. In such a process, the tungsten nucleation layer is poisoned in order to prevent nucleation. The poisoning is selectively implemented in order to completely poison the nucleation layer in the wide pitch regions of the CTF memory cells or the MIM capacitor, whereas the narrow pitch regions of the transistor devices is only partially poisoned. The partial poisoning allows for bottom-up fill of the gate electrode in the transistor devices, without deposition in the CTF memory cells or the MIM capacitor. Processing may then continue with deposition (without the need for lithography) of the layers of the CTF memory cells or the MIM capacitor.

Manufacturing processes such as those disclosed herein provide unique characteristics in the microstructure of the gate electrode of the transistor and an electrode of the CTF memory cell or the MIM capacitors. Particularly, the gate electrode of the transistor will have a first average grain size, and the CTF memory cell or the MIM capacitors will have an electrode with a second average grain size that is larger than the first average grain size. The disparity in average grain size is due (at least in part) to differences in deposition temperature. For example, the gate electrode will be deposited at a lower temperature than the electrode of the CTF memory cell or the MIM capacitors.

Referring now to FIG. 1A, a cross-sectional illustration of a CTF memory cell 110 in a device 100 is shown, in accordance with an embodiment. The CTF memory cell 110 may be referred to herein as a "memory cell" for simplicity. In an embodiment, the memory cell 110 may be disposed over a substrate 101. In a particular embodiment, the substrate 101 may comprise a fin that extends up from an underlying substrate. FIG. 1A may be a cross-section along the length of the fin.

In an embodiment, the underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, the memory cell 110 may be positioned between a pair of source/drain (S/D) regions 102. The S/D region 102 may be disposed into the substrate 101, as is known in the art. The S/D regions 102 are typically formed by one of two conventional processes. The first process is to implant dopants such as boron, arsenic, or phosphorous into the substrate and then activate those dopants through an annealing process. In the second process, the substrate 101 may be etched to form recesses. These recesses may then be filled with a silicon alloy using a selective epitaxial deposition process. In some implementations, the silicon alloy may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum.

In an embodiment, spacers 104 with an insulating fill layer 103 may be positioned over the S/D regions 102. Interconnects (not shown) may replace portions of the insulating fill layer 103 in subsequent processing operations to provide contacts to the S/D regions 102. In an embodiment, the S/D regions 102 and the substrate 101 between the S/D regions 102 may be held at ground potential during operation of the memory cell 110.

In an embodiment, the memory cell 110 may comprise a plurality of layers between spacers 104. In an embodiment, the memory cell 110 comprises a high-k tunnel barrier layer 111 over the substrate 101. The high-k tunnel barrier layer 111 may comprise oxides such as silicon oxide or any other high-k dielectric. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

A floating gate electrode 112 may be disposed over the tunnel barrier layer 111. The floating gate electrode 112 may be a poisoned tungsten nucleation layer. A more detailed description of a poisoned tungsten nucleation layer is provided below. As used herein, "floating" refers to a conductive feature that is not held at a particular voltage. That is, the floating gate electrode 112 may not be directly connected to other circuitry within the device 100.

In an embodiment, a charge trapping layer 113 (referred to herein as a "trap layer") is provided over the floating gate electrode 112. The trap layer 113 may be an oxide or a nitride. In an embodiment, a control electrode 114 is disposed over the trap layer 113. In an embodiment, the control electrode 114 may be tungsten or the like. As will be described in greater detail below, the control electrode 114 may have a crystal structure that is different than the crystal structure of gate electrodes in other portions of the device 100. Particularly, the control electrode 114 is formed with a high temperature process that provides larger average grain sizes than that of gate electrodes formed elsewhere in the device 100.

As shown in FIG. 1A, several components of the memory cell 110 have a U-shaped cross-section. Particularly, the barrier layer 111, the floating gate electrode 112, and the trap layer 113 have U-shaped cross-sections. The control electrode 114 may have a substantially rectangular cross-section.

The U-shaped cross-sections of the various layers are the result of a self-aligned assembly process. The use of a self-aligned assembly process results in no overlay error in the memory cell 110.

Figure 1B:
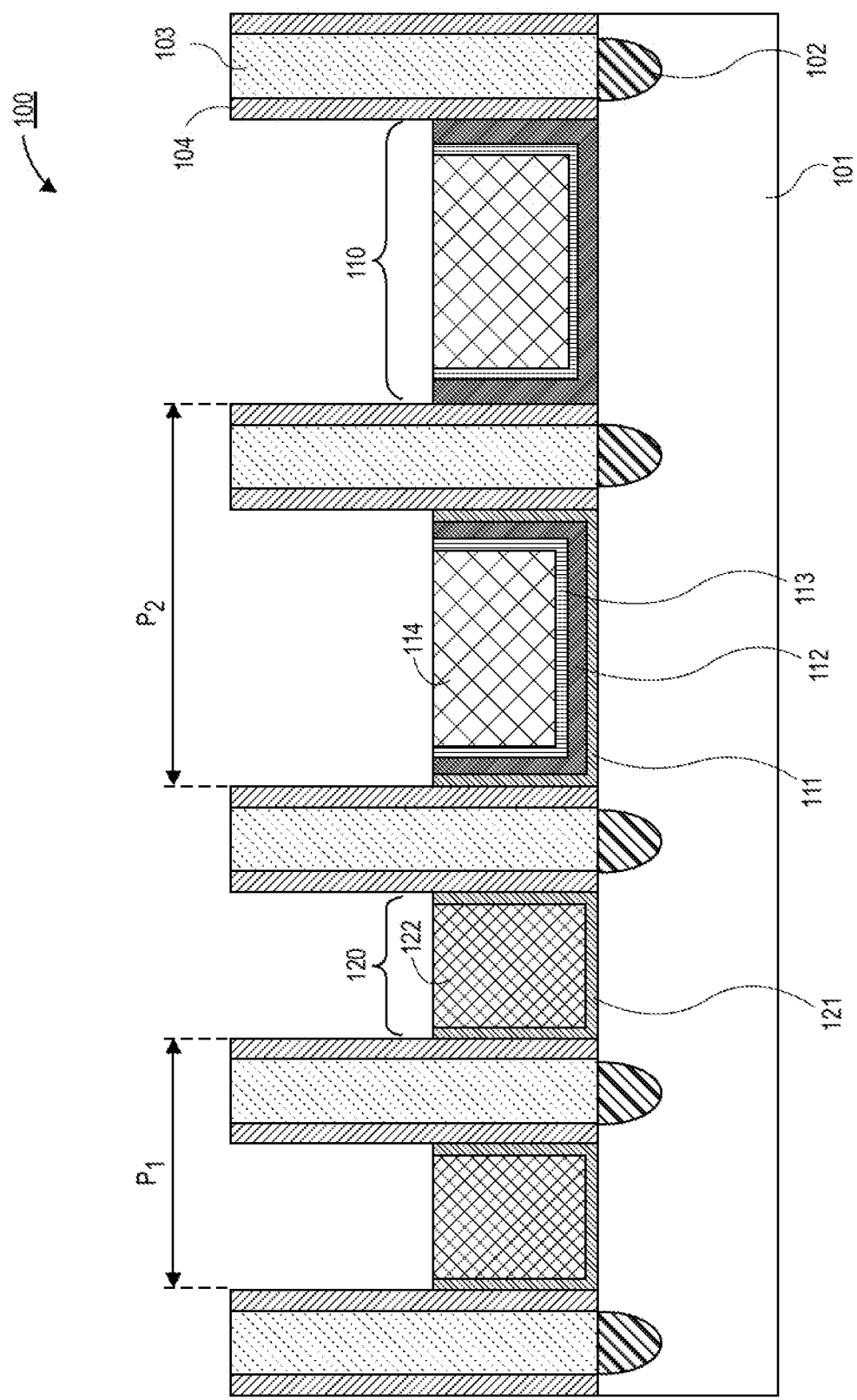
FIG. 1B is a cross-sectional illustration of CTF memory cells fabricated on the same fin as transistor devices, in accordance with an embodiment.

Referring now to FIG. 1B, a cross-sectional illustration of a device 100 is shown, in accordance with an embodiment. The device 100 comprises transistors 120 and memory cells 110 over the substrate 101. In an embodiment, the transistors 120 are arranged at a first pitch $P_1$ and the memory cells 110 are arranged at a second pitch $P_2$. In an embodiment, the second pitch $P_2$ is greater than the first pitch $P_1$. In some embodiments, the transistors 120 and the memory cells 110 may be fabricated along a single fin. In other embodiments, the transistors 120 and the memory cells 110 are fabricated on different fins.

In an embodiment, the transistors 120 comprise a gate electrode 122 and a gate dielectric 121. The gate electrode 122 may be between S/D regions 102. In an embodiment, the gate dielectric 121 may comprise the same material as the barrier layer 111 of the memory cells 110. In an embodiment, the memory cells 110 may be substantially similar to the memory cell 110 described above with respect to FIG. 1A.

In an embodiment, the gate electrode 122 may comprise a material that is similar to the material of the control electrode 114. However, the crystal structure of the gate electrode 122 may be different than a crystal structure of the control electrode 114. The difference in crystal structure may arise from different deposition processes. For example, the gate electrode 122 may be deposited at a first temperature, and the control electrode 114 may be deposited at a second, higher, temperature. In an embodiment, the gate electrode 122 may have a first average grain size, and the control electrode 114 may have a second average grain size that is larger than the first average grain size. In an embodiment, the first average grain size may be approximately 6 nm or less and the second average grain size may be approximately 6 nm or greater.

Figure 2A:
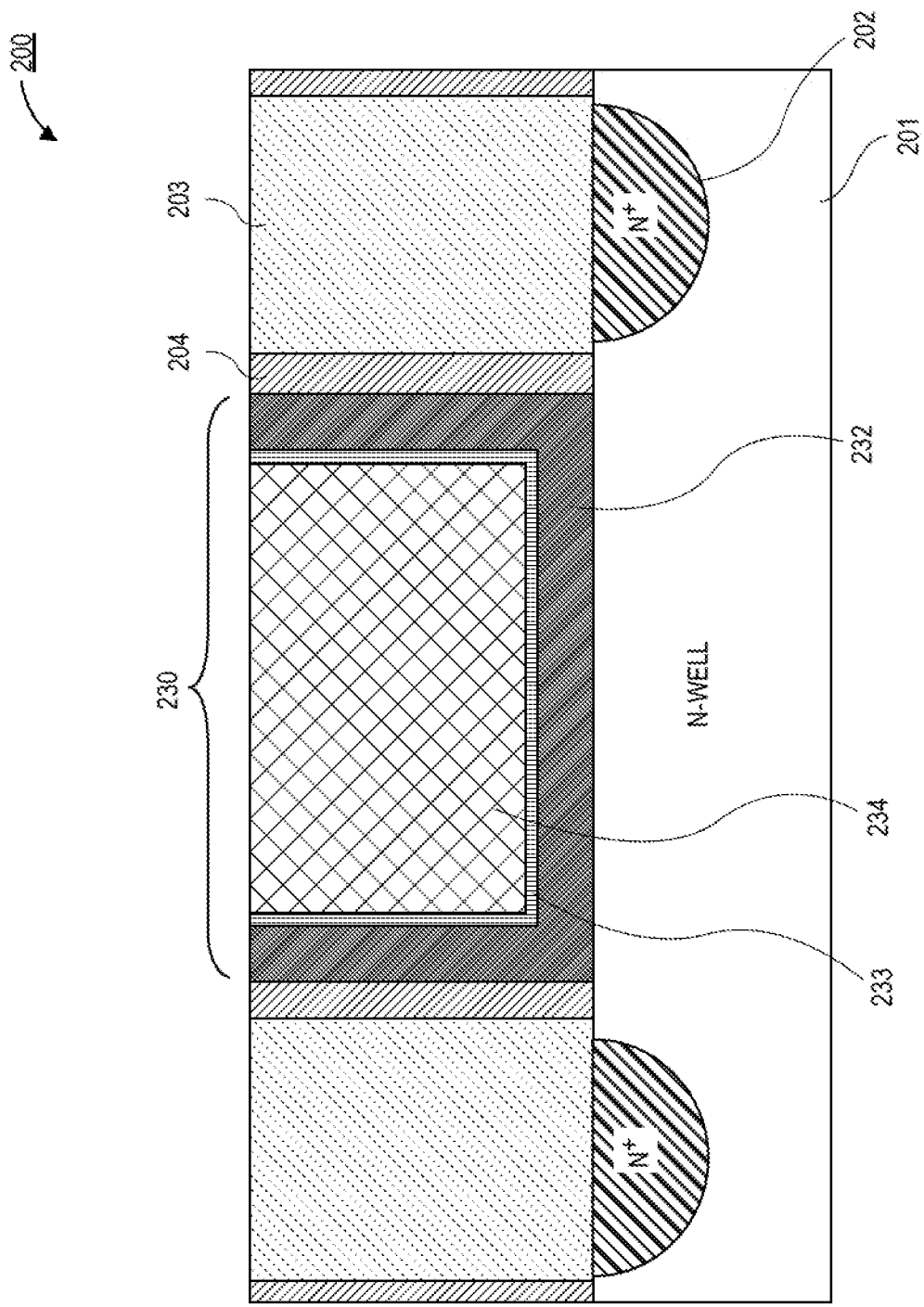
FIG. 2A is a cross-sectional illustration of a front end capacitor, in accordance with an embodiment.

Referring now to FIG. 2A, a cross-sectional illustration of a device 200 with a front end MIM capacitor 230 (referred to herein simply as "capacitor") is shown, in accordance with an embodiment. In an embodiment, the capacitor 230 is positioned between spacers 204. Pairs of spacers 204 may be separated by an insulating fill layer 203. The insulating fill layer 203 is disposed over S/D regions 202. In the particular embodiment shown in FIG. 2A, the S/D regions 202 are $N^+$ regions with an N-well in the substrate 201 between the S/D regions 202.

In an embodiment, the N-well region is directly contacted by a bottom electrode 232. A dielectric layer 233 is disposed over the bottom electrode 232. The dielectric layer 233 may be any suitable high-k dielectric material. Particularly, since the capacitor 230 is fabricated using front end processing, the material of the dielectric layer 233 may be selected from a larger group of materials that is available for BEOL devices. For example, the dielectric layer 233 may be any of the high-k materials listed above. Accordingly, by selection of material and thickness, the capacitor 230 may be finely tuned to provide a desired capacitance value. In an embodiment, a top electrode 234 is disposed over the dielectric layer 233.

As shown in FIG. 2A, several components of the capacitor 230 have a U-shaped cross-section. Particularly, the bottom electrode 232 and the dielectric layer 233 have U-shaped cross-sections. The top electrode 234 may have a substantially rectangular cross-section. The U-shaped cross-sections of the various layers are the result of a self-aligned assembly process. The use of a self-aligned assembly process results in no overlay error in the capacitor 230.

Figure 2B:
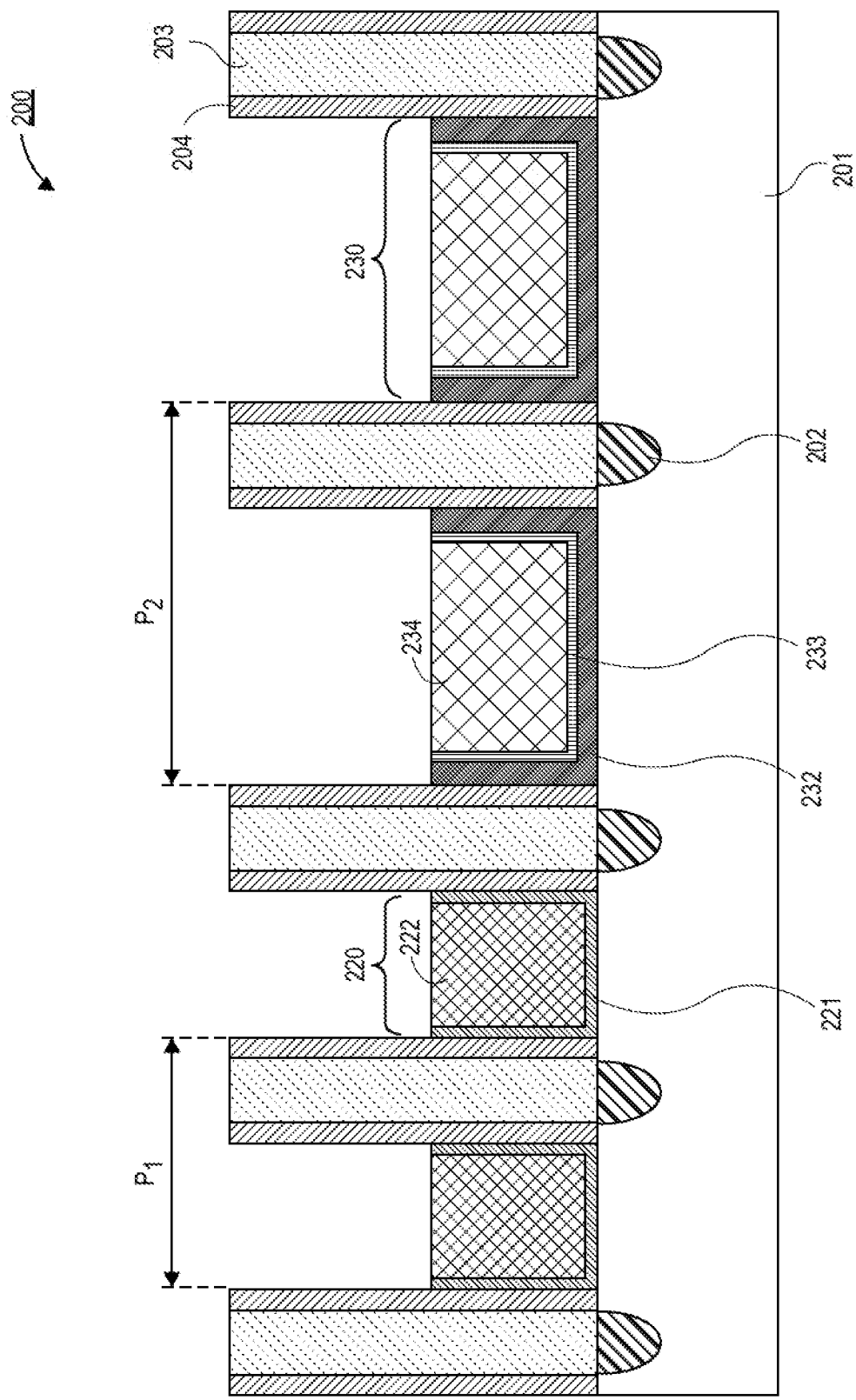
FIG. 2B is a cross-sectional illustration of front end capacitors fabricated on the same fin as transistor devices, in accordance with an embodiment.

Referring now to FIG. 2B, a cross-sectional illustration of a device 200 with transistors 220 and capacitors 230 over a substrate 201 is shown, in accordance with an embodiment. In an embodiment, the transistors 220 are arranged at a first pitch $P_1$ and the capacitors 230 are arranged at a second pitch $P_2$. In an embodiment, the second pitch $P_2$ is greater than the first pitch $P_1$. In some embodiments, the transistors 220 and the capacitors 230 may be fabricated along a single fin. In other embodiments, the transistors 220 and the capacitors 230 are fabricated on different fins.

In an embodiment, the transistors 220 comprise a gate electrode 222 and a gate dielectric 221. The gate electrode 222 may be between S/D regions 202. In an embodiment, the capacitors 230 may be substantially similar to the capacitor 230 described above with respect to FIG. 2A.

In an embodiment, the gate electrode 222 may comprise a material that is similar to the material of the top electrode 234. However, the crystal structure of the gate electrode 222 may be different than a crystal structure of the top electrode 234. The difference in crystal structure may arise from different deposition processes. For example, the gate electrode 222 may be deposited at a first temperature, and the top electrode 234 may be deposited at a second, higher, temperature. In an embodiment, the gate electrode 222 may have a first average grain size, and the top electrode 234 may have a second average grain size that is larger than the first average grain size. In an embodiment, the first average grain size may be approximately 6 nm or less and the second average grain size may be approximately 6 nm or greater.

Referring now to FIGS. 3A-3H, a series of cross-sectional illustrations depicting a process to form transistors and self-aligned CTF memory cells is shown, in accordance with an embodiment.

Figure 3A:
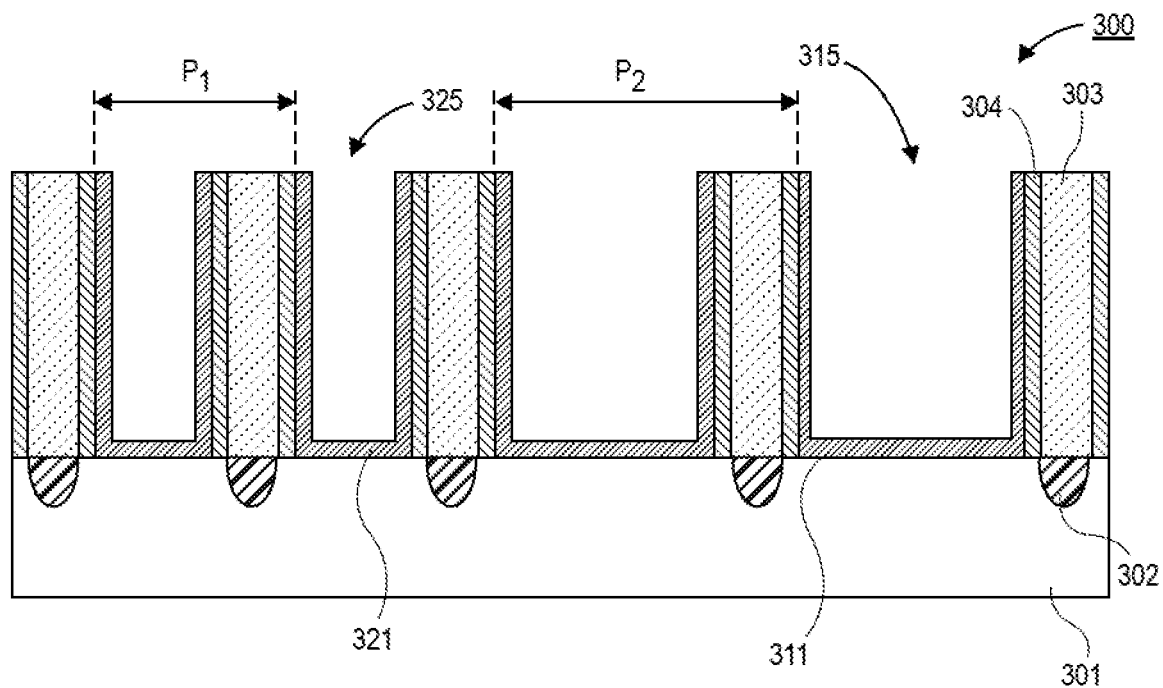
FIGS. 3A-3H are cross-sectional illustrations illustrating a process for forming self-aligned CTF memory cells in parallel with transistor devices on a single fin, in accordance with an embodiment.

Referring now to FIG. 3A, a cross-sectional illustration of a device 300 is shown, in accordance with an embodiment. In an embodiment, the device 300 comprises a plurality of S/D regions 302 within a substrate 301. In an embodiment, the substrate 301 comprises a fin. Spacers 304 and insulating fill material 303 may be disposed over each of the S/D regions 302. In an embodiment, first openings 325 are provided between spacers 304, and second openings 315 are provided between spacers 304. The first openings 325 may have a first pitch $P_1$ and the second openings 315 may have a second pitch $P_2$ that is larger than the first pitch $P_1$.

In an embodiment, a dielectric layer 321/311 is disposed in the first openings 325 and the second openings 315, respectively. The dielectric layers 321 and 311 may be substantially similar to each other. The dielectric layer 321 may be used as a gate dielectric for a transistor, and the dielectric layer 311 may be used as a tunnel barrier layer. Both gate dielectrics and tunnel barrier layers optimally utilize a high-k dielectric material, such as those described above.

Figure 3B:
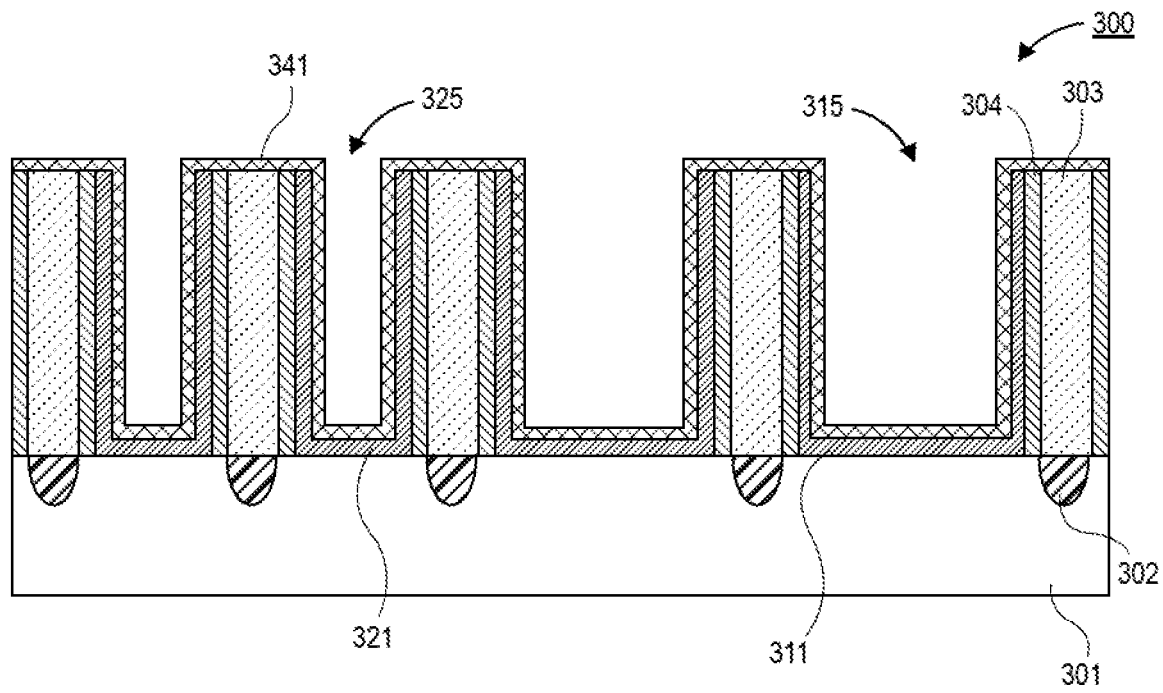

Referring now to FIG. 3B, a cross-sectional illustration of the device 300 after a conductive nucleation layer 341 is disposed over exposed surfaces is shown, in accordance with an embodiment. In an embodiment, the nucleation layer 341 may be a conformally deposited conductive layer. For example, atomic layer deposition (ALD) may be used to deposit the nucleation layer 341. In an embodiment, the nucleation layer 341 may comprise tungsten. The nucleation layer 341 lines the first opening 325 and the second opening 315.

Figure 3C:
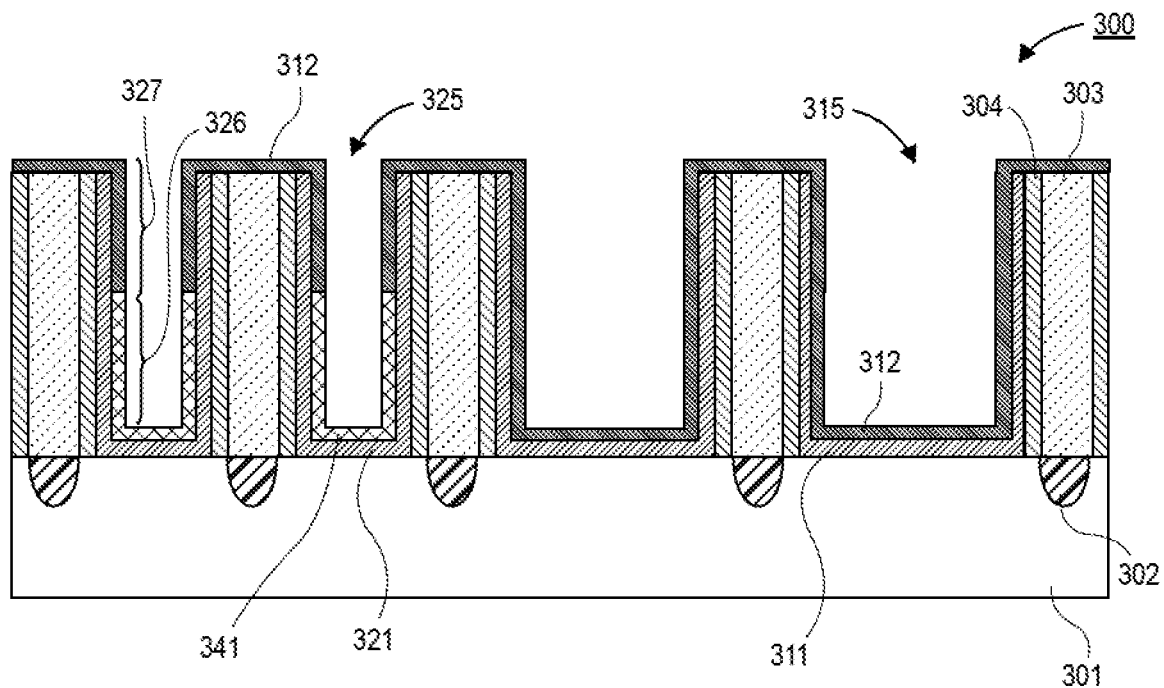

Referring now to FIG. 3C, a cross-sectional illustration of the device 300 after a selective nucleation poisoning process is implemented is shown, in accordance with an embodiment. The selective nucleation poisoning process converts portions of the nucleation layer 341 into a material that will not initiate growth in low temperature deposition processes. In an embodiment, the nucleation poisoning process may include the use of a remote plasma with introduction of boron. In an embodiment, the larger pitch of the second openings 315 allow for complete poisoning and conversion to conducting layer 312. The conducting layer 312 will be used as the floating electrode in the resulting memory cell.

The smaller pitch of the first openings 325 provides an aspect ratio that does not allow for complete conversion of the nucleation layer 341. As shown, a bottom portion 326 of the first openings 325 maintain the original nucleation layer 341, and a top portion 327 of the first openings 325 includes converted conductive layer 312. Accordingly, during the low temperature deposition process, the first openings 325 will fill from the bottom up, and will not form voids.

Figure 3D:
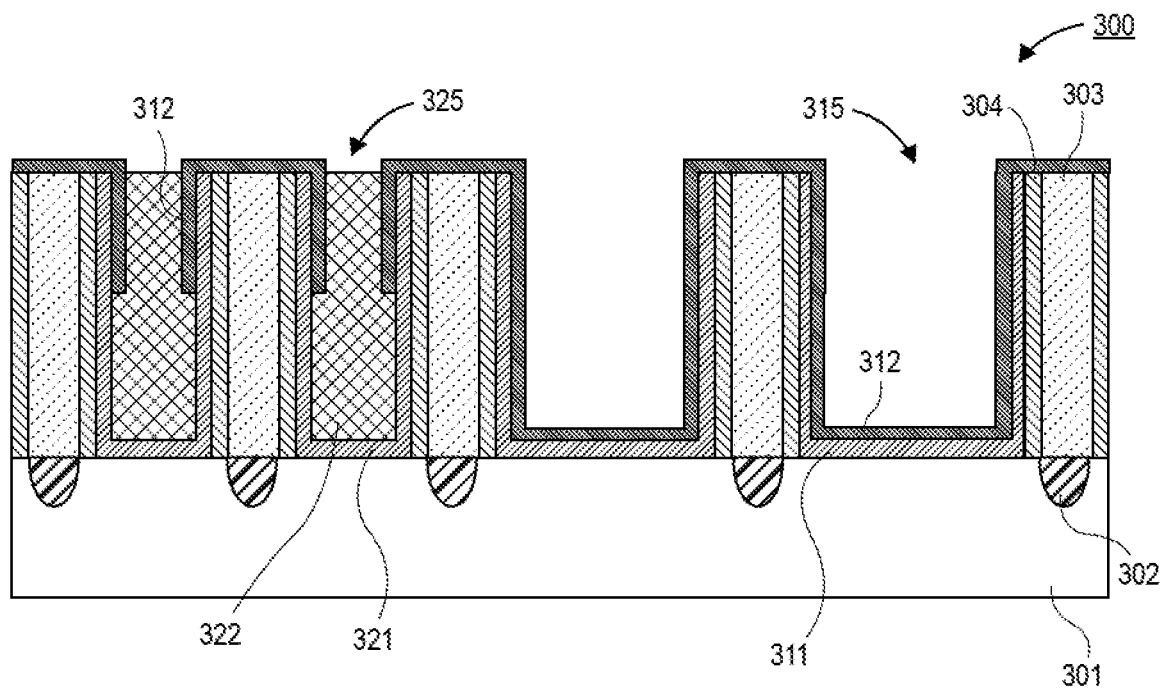

Referring now to FIG. 3D, a cross-sectional illustration of the device 300 after a first conductive material deposition process is shown, in accordance with an embodiment. As shown, a gate electrode 322 is disposed in the first openings 325. Due to the selective poisoning of the layer 312, the gate electrode 322 is deposited with a bottom-up fill process. In an embodiment, the gate electrode 322 is deposited with a low temperature process, such as a low temperature chemical vapor deposition (CVD) fill. Since the nucleation layer in the second openings 315 is completely poisoned, the second openings 315 remain open.

Figure 3E:
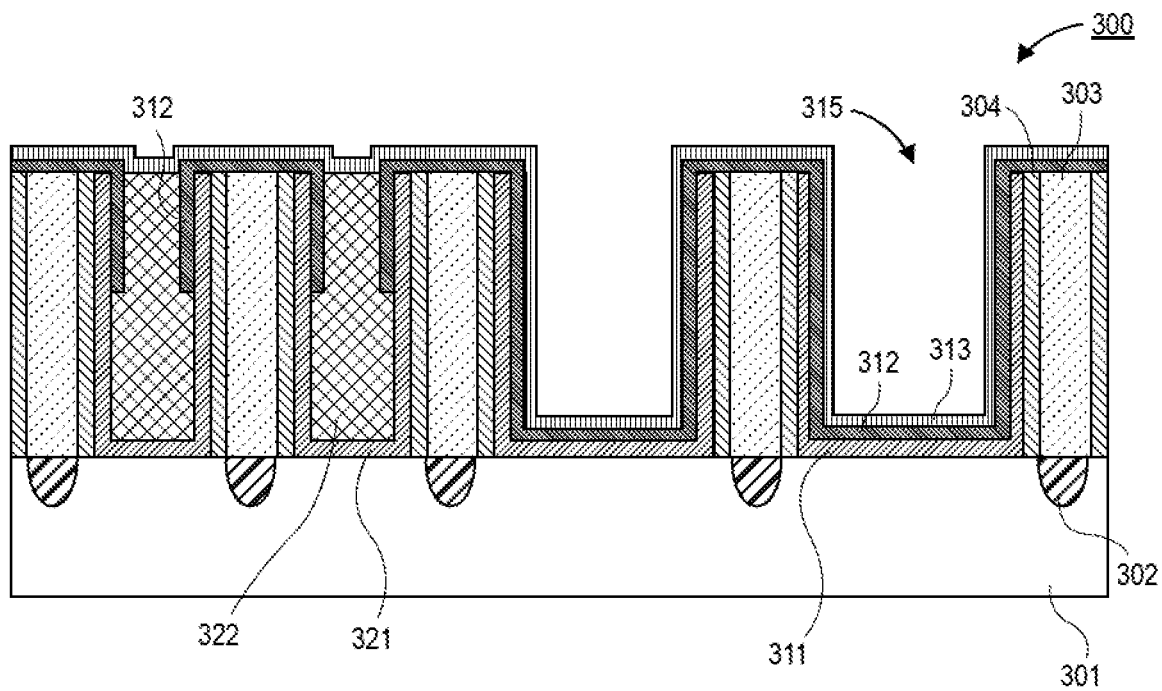

Referring now to FIG. 3E, a cross-sectional illustration of the device 300 after a charge trapping layer 313 is disposed over the exposed surfaces is shown, in accordance with an embodiment. The charge trapping layer 313 lines the floating electrode 312 in the second openings 315. The charge trapping layer 313 may be deposited with a CVD or an ALD process.

Figure 3F:
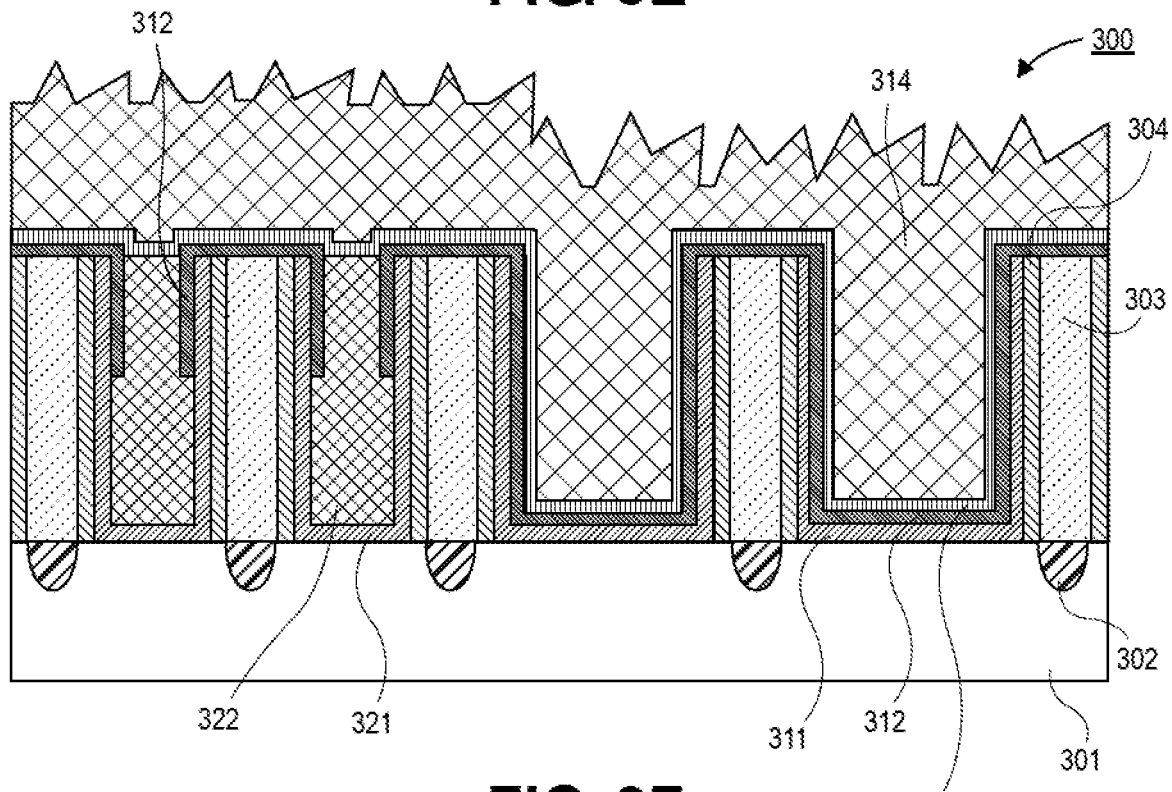

Referring now to FIG. 3F, a cross-sectional illustration of the device 300 after a second conductive material deposition process is implemented. In an embodiment, the deposition process may be a high temperature deposition process (e.g. at a temperature higher than the low temperature deposition process disclosed with respect to FIG. 3D). The high temperature deposition process results in the conductive material 314 being blanket deposited over all exposed surfaces. The portion of the conductive material 314 within the second openings 315 may be referred to as the control electrode of the memory cell.

In an embodiment, the conductive material 314 may be the same material as the gate electrode 322. For example, the conductive material 314 and the gate electrode 322 may be tungsten. However, due to the different deposition temperatures, a crystal structure of the conductive material 314 may be different than a crystal structure of the gate electrode 322. Particularly, the gate electrode 322 may have a first average grain size, and the conductive material 314 may have a second average grain size that is larger than the first average grain size. In an embodiment, the first average grain size may be approximately 6 nm or less and the second average grain size may be approximately 6 nm or greater.

Figure 3G:
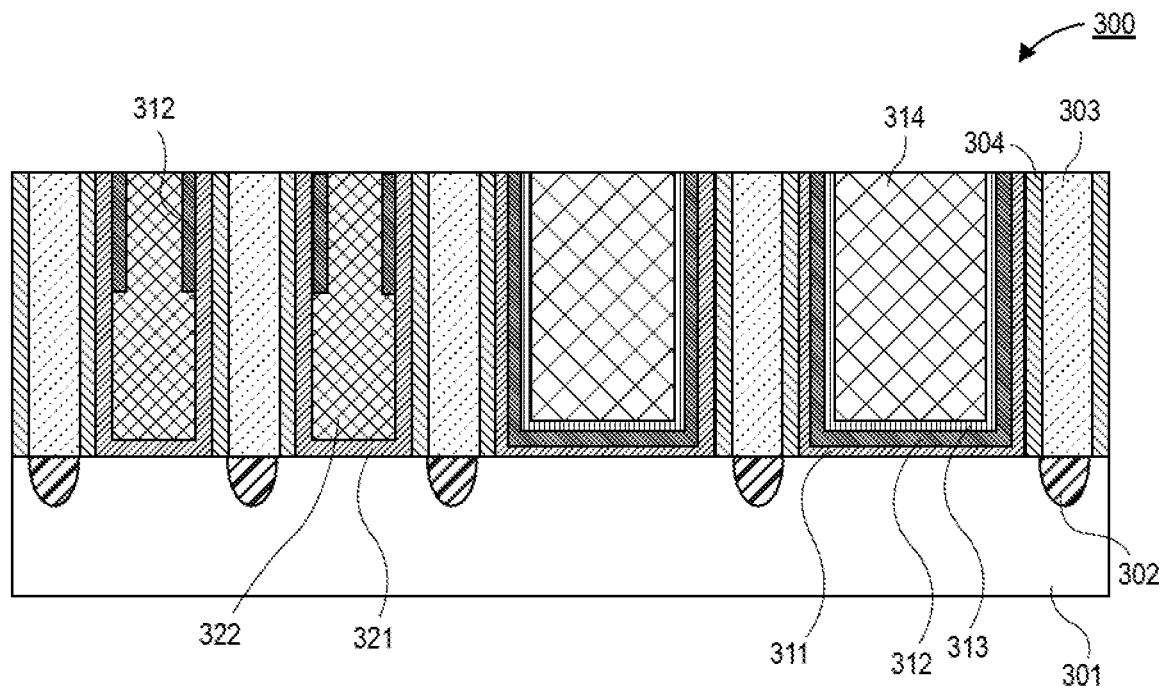

Referring now to FIG. 3G, a cross-sectional illustration of the device 300 after the conductive material is planarized with top surfaces of the spacers 304 is shown, in accordance with an embodiment. In an embodiment, the planarization may be implemented with any suitable polishing process (e.g., chemical mechanical polishing (CMP), etc.). The polishing process results in the conductive material 314 being isolated to each second opening 315 so that there are no shorts between control electrodes 314 of each memory cell.

Figure 3H:
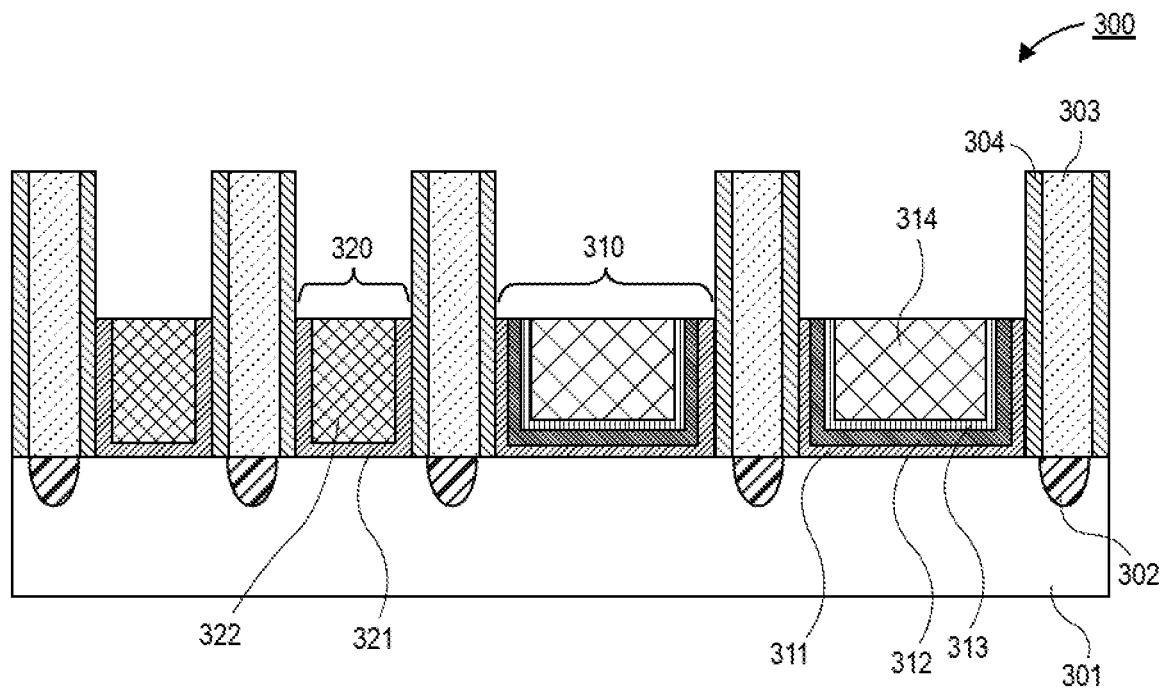

Referring now to FIG. 3H, a cross-sectional illustration of the device 300 after the layers are recessed below the top surfaces of the spacers 304 is shown, in accordance with an embodiment. As shown, the gate electrode 322 of transistor devices 320 are provided in the first openings 325, and memory cells 310 are provided within the second openings 315.

The memory cells 310 comprise a barrier layer 311, a floating electrode 312, a trap layer 313, and a control electrode 314. The barrier layer 311, the floating electrode 312, and the trap layer 313 may have substantially U-shaped cross-sections. The control electrode 314 may have a substantially rectangular cross-section. Additionally, the memory cell 310 is fabricated without the need for additional lithography operations. As such, the memory cell 310 may be referred to as being a self-aligned structure.

Referring now to FIGS. 4A-4H, a series of cross-sectional illustrations depicting a process for forming transistors and self-aligned FEOL MIM capacitors is shown, in accordance with an embodiment.

Figure 4A:
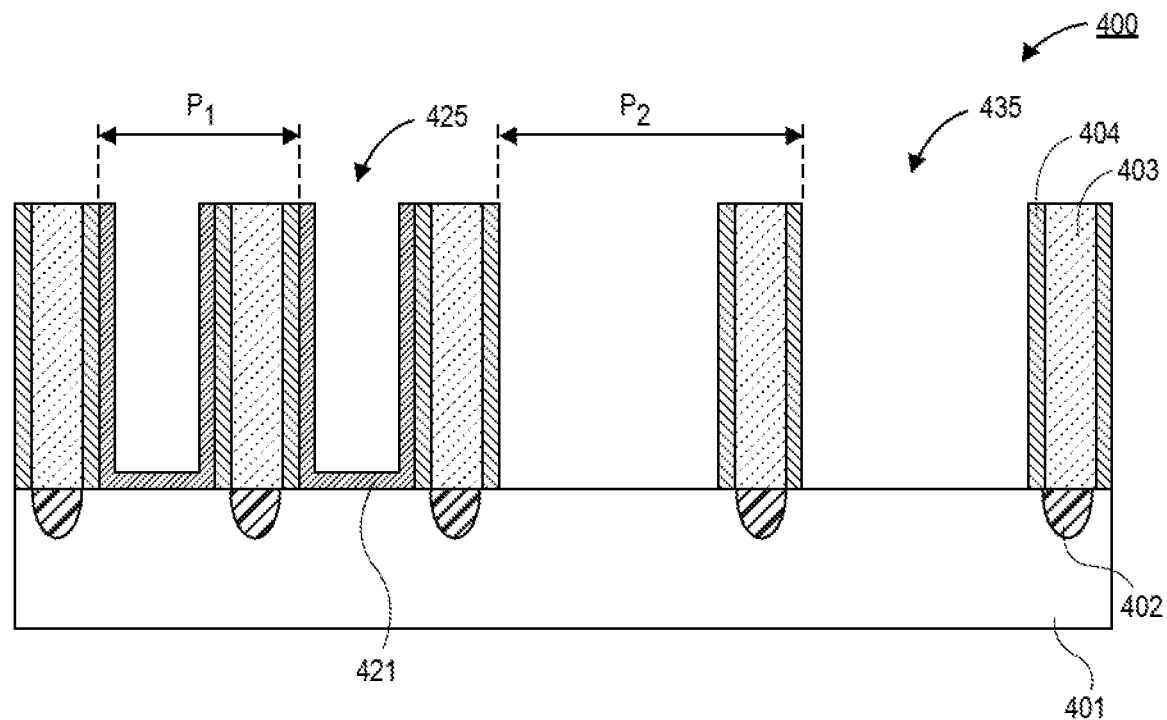
FIGS. 4A-4H are cross-sectional illustrations depicting a process for forming self-aligned front end capacitors in parallel with transistor devices on a single fin, in accordance with an embodiment.

Referring now to FIG. 4A, a cross-sectional illustration of a device 400 is shown, in accordance with an embodiment. In an embodiment, the device 400 comprises a plurality of S/D regions 402 within a substrate 401. In an embodiment, the substrate 401 comprises a fin. Spacers 404 and insulating fill material 403 may be disposed over each of the S/D regions 402. In an embodiment, first openings 425 are provided between spacers 404, and second openings 435 are provided between spacers 404. The first openings 425 may have a first pitch $P_1$ and the second openings 435 may have a second pitch $P_2$ that is larger than the first pitch $P_1$.

In an embodiment, a dielectric layer 421 is disposed in the first openings 425. The second openings 435 may not have the dielectric layer 421. For example, the dielectric layer in the second openings 435 may be cleared with a suitable etching process.

Figure 4B:
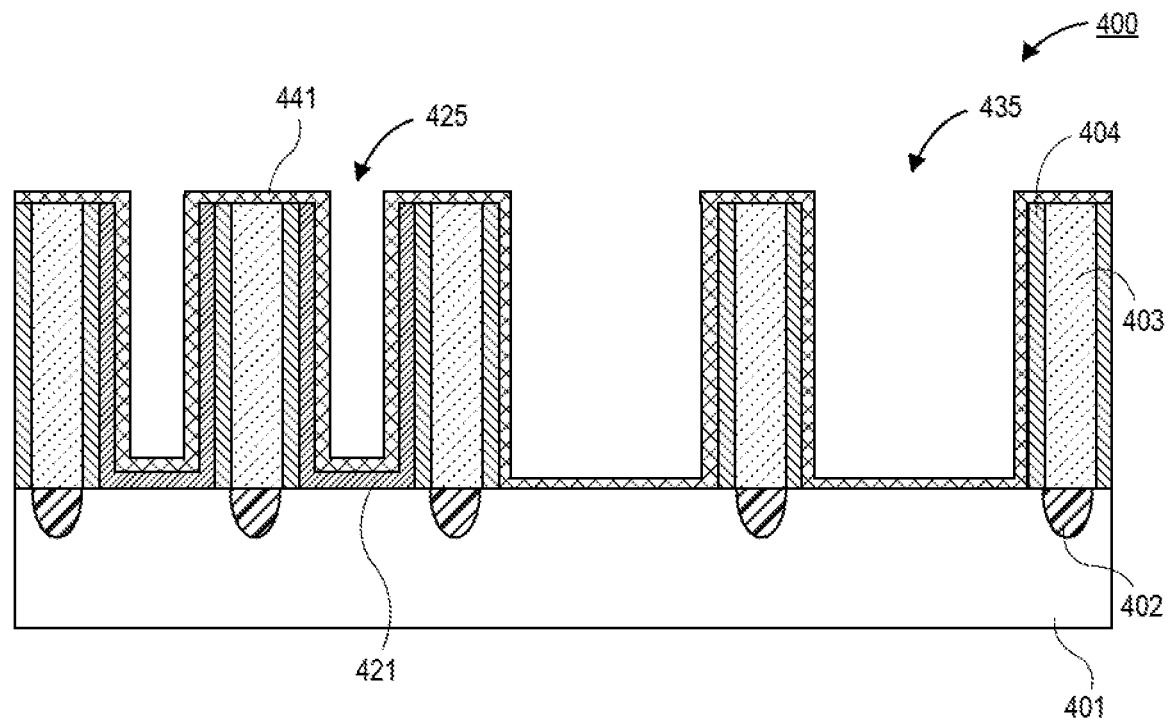

Referring now to FIG. 4B, a cross-sectional illustration of the device 400 after a conductive nucleation layer 441 is disposed over exposed surfaces is shown, in accordance with an embodiment. In an embodiment, the nucleation layer 441 may be a conformally deposited conductive layer. For example, ALD may be used to deposit the nucleation layer 441. In an embodiment, the nucleation layer 441 may comprise tungsten. The nucleation layer 441 lines the first opening 425 and the second opening 435. In the second opening 435, the nucleation layer 441 may be in direct contact with the substrate 401.

Figure 4C:
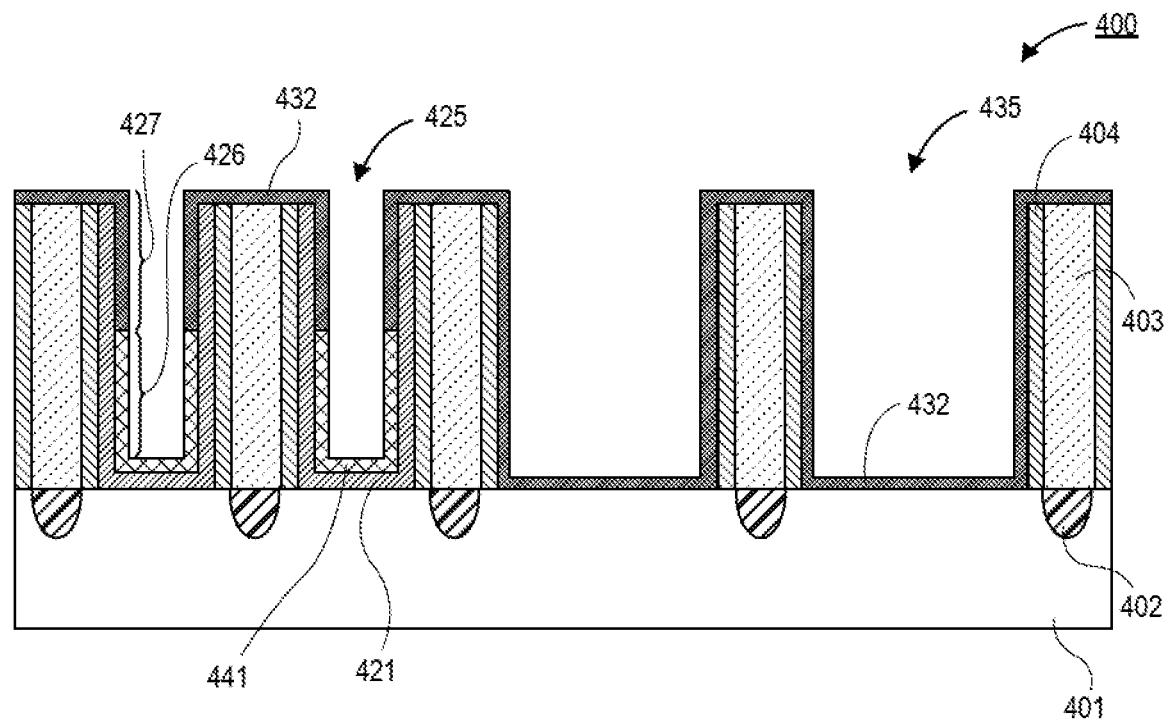

Referring now to FIG. 4C, a cross-sectional illustration of the device 400 after a selective nucleation poisoning process is implemented is shown, in accordance with an embodiment. The selective nucleation poisoning process converts portions of the nucleation layer 441 into a material that will not initiate growth in low temperature deposition processes. In an embodiment, the nucleation poisoning process may include the use of a remote plasma with introduction of boron. In an embodiment, the larger pitch of the second openings 435 allow for complete poisoning and conversion to conducting layer 432. The conducting layer 432 will be used as the bottom electrode in the resulting capacitor.

The smaller pitch of the first openings 425 provides an aspect ratio that does not allow for complete conversion of the nucleation layer 441. As shown, a bottom portion 426 of the first openings 425 maintain the original nucleation layer 441, and a top portion 427 of the first openings 425 include converted conducting layer 432. Accordingly, during the low temperature deposition process, the first openings 425 will fill from the bottom up, and will not form voids.

Figure 4D:
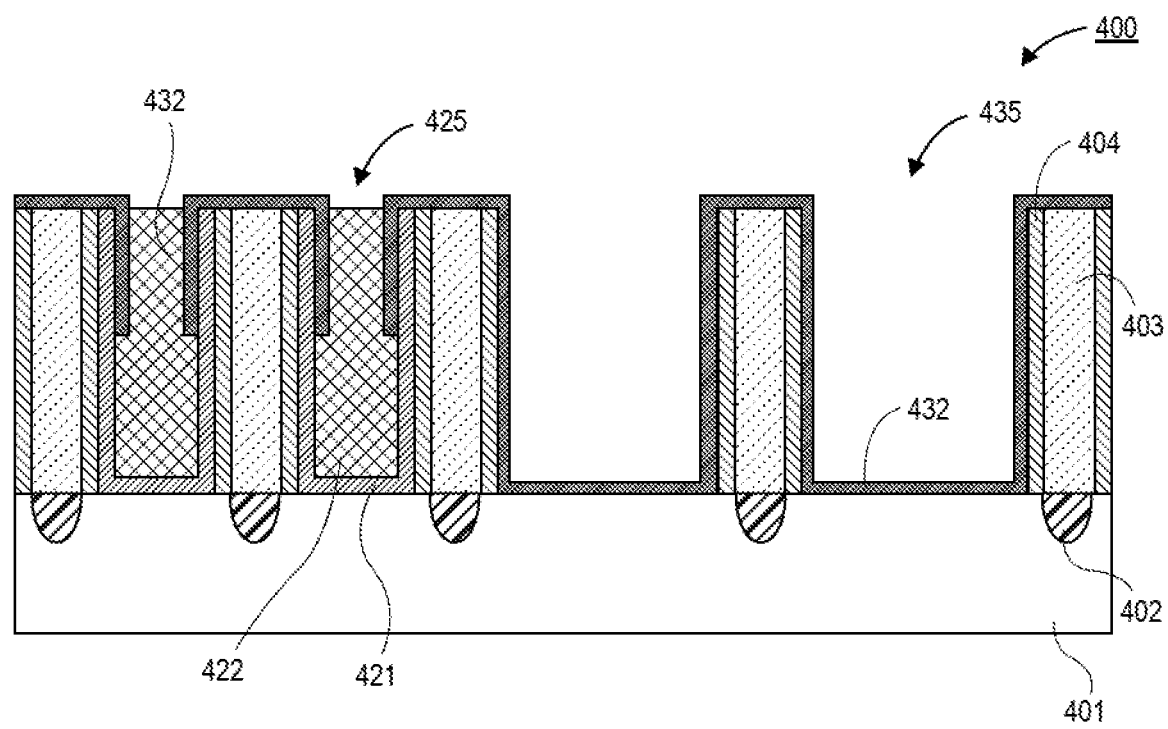

Referring now to FIG. 4D, a cross-sectional illustration of the device 400 after a first conductive material deposition process is shown, in accordance with an embodiment. As shown, a gate electrode 422 is disposed in the first openings 425. Due to the selective poisoning of the layer 432, the gate electrode 422 is deposited with a bottom-up fill process. In an embodiment, the gate electrode 422 is deposited with a low temperature process, such as a low temperature CVD fill. Since the nucleation layer in the second openings 435 is completely poisoned, the second openings 435 remain open.

Figure 4E:
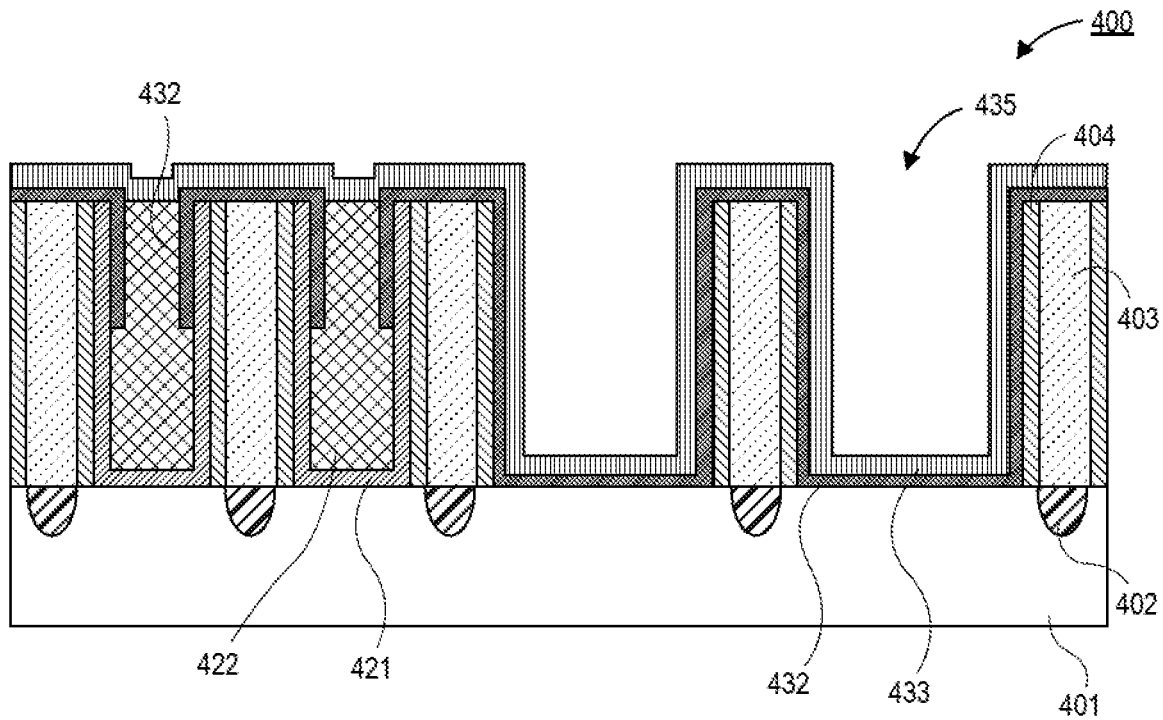

Referring now to FIG. 4E, a cross-sectional illustration of the device 400 after a dielectric layer 433 is disposed over the exposed surfaces is shown, in accordance with an embodiment. The dielectric layer 433 lines the bottom electrode 432 in the second openings 435. The dielectric layer 433 may be deposited with a CVD or an ALD process. The dielectric layer 433 may be any suitable high-k dielectric material. Particularly, since the capacitor is fabricated using front end processing, the material of the dielectric layer 433 may be selected from a larger group of materials than is available for BEOL devices. For example, the dielectric layer 433 may be any of the high-k materials listed above. Accordingly, by selection of material and thickness, the capacitor may be finely tuned to provide a desired capacitance value.

Figure 4F:
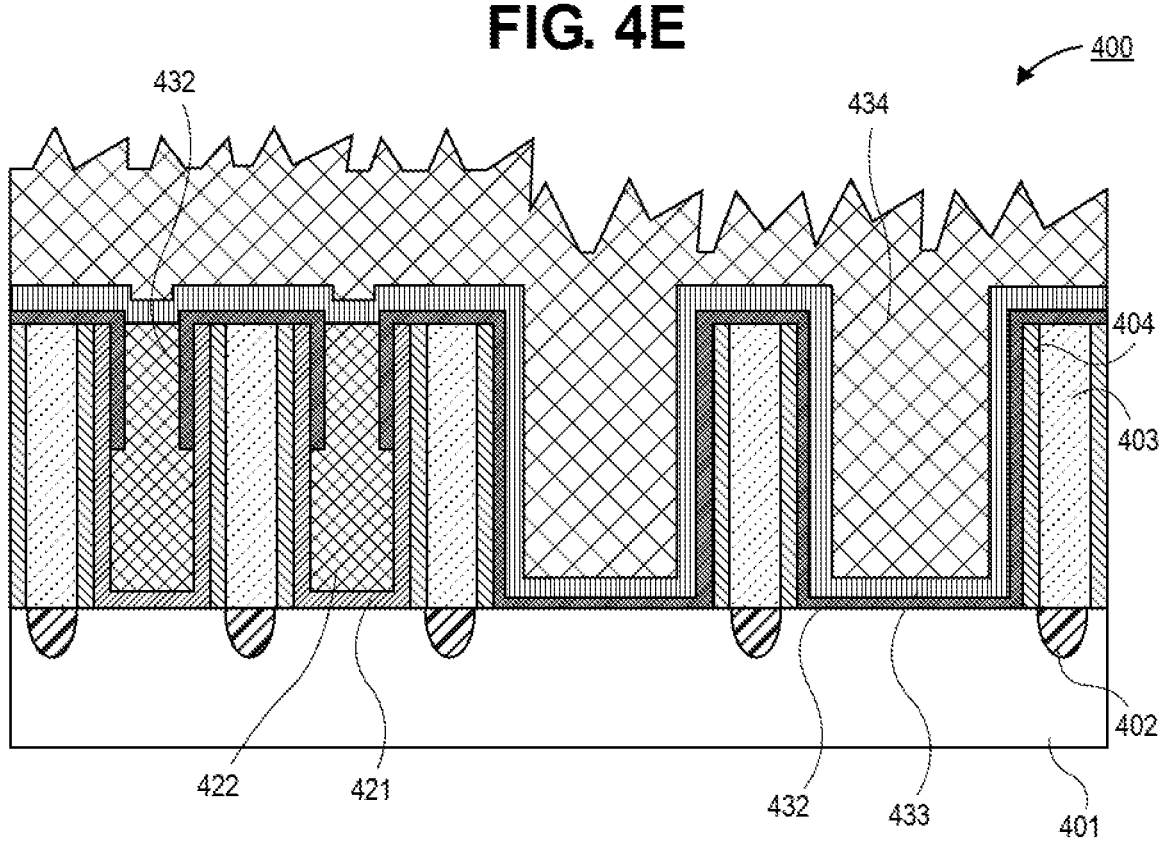

Referring now to FIG. 4F, a cross-sectional illustration of the device 400 after a second conductive material deposition process is implemented. In an embodiment, the deposition process may be a high temperature deposition process (e.g. a temperature higher than the low temperature deposition process disclosed with respect to FIG. 4D). The high temperature deposition process results in the conductive material 434 being blanket deposited over all exposed surfaces. The portion of the conductive material 434 within the second openings 435 may be referred to as the top electrode of the capacitor.

In an embodiment, the conductive material 434 may be the same material as the gate electrode 422. For example, the conductive material 434 and the gate electrode 422 may be tungsten. However, due to the different deposition temperatures, a crystal structure of the conductive material 434 may be different than a crystal structure of the gate electrode 422. Particularly, the gate electrode 422 may have a first average grain size, and the conductive material 434 may have a second average grain size that is larger than the first average grain size. In an embodiment, the first average grain size may be approximately 6 nm or less and the second average grain size may be approximately 6 nm or greater.

Figure 4G:
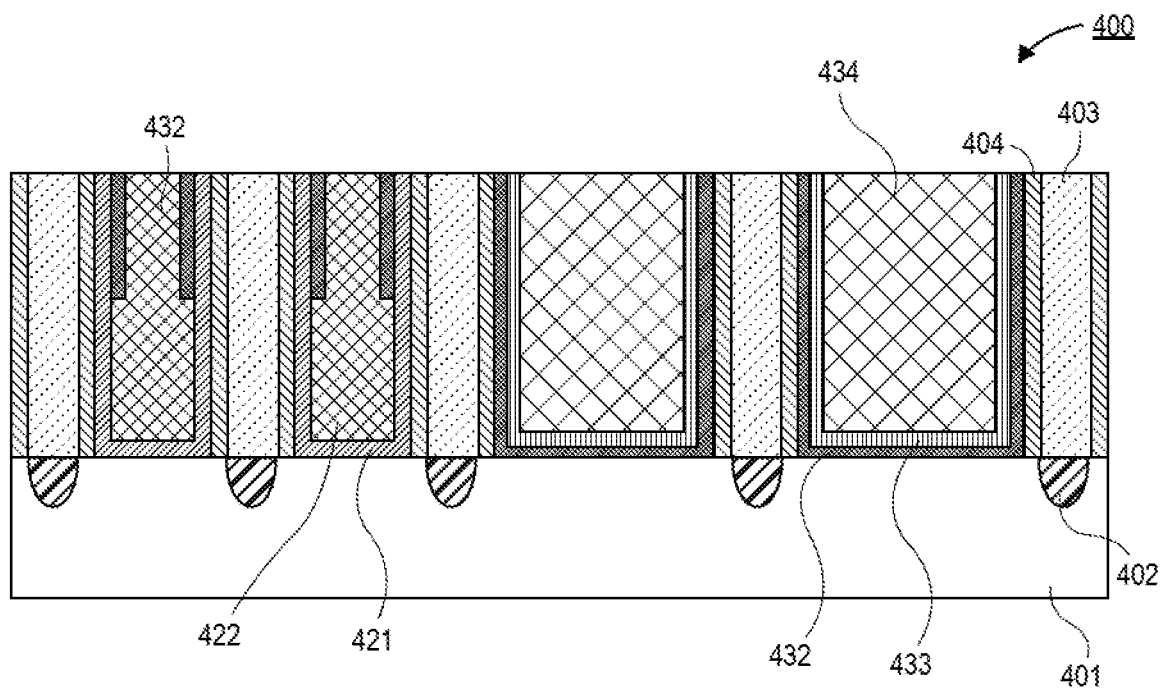

Referring now to FIG. 4G, a cross-sectional illustration of the device 400 after the conductive material is planarized with top surfaces of the spacers 404 is shown, in accordance with an embodiment. In an embodiment, the planarization may be implemented with any suitable polishing process (e.g., CMP, etc.). The polishing process results in the conductive material 434 being isolated to each second opening 435 so that there are no shorts between top electrodes 434 of each capacitor.

Figure 4H:
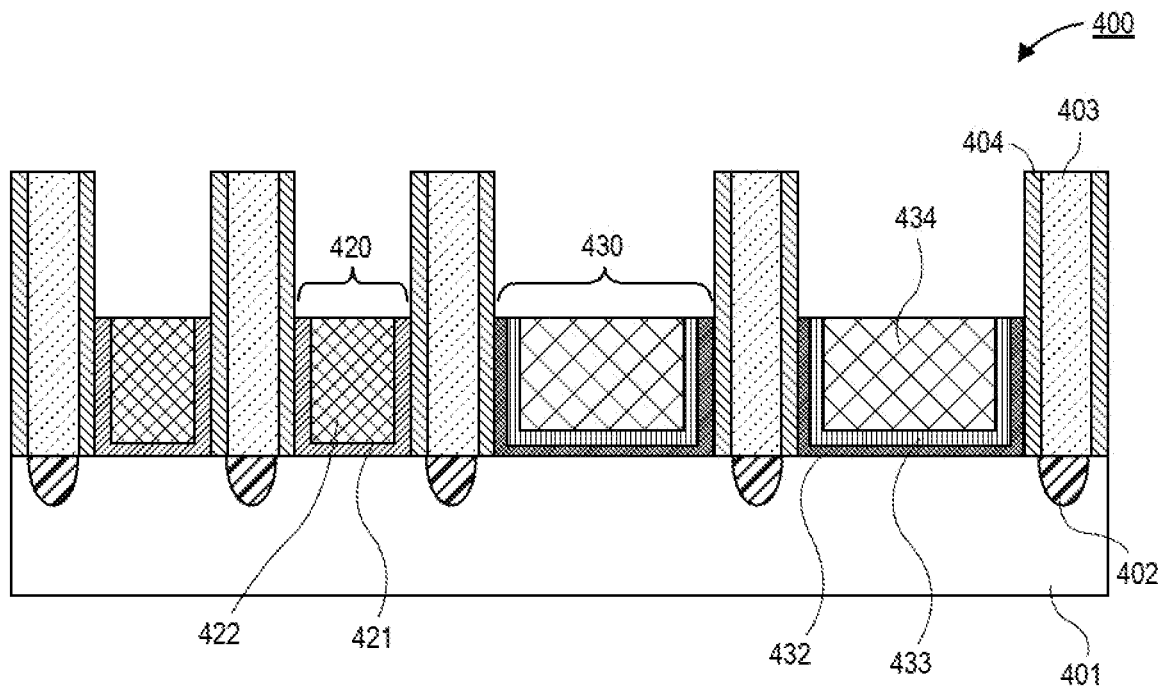

Referring now to FIG. 4H, a cross-sectional illustration of the device 400 after the layers are recessed below the top surfaces of the spacers 404 is shown, in accordance with an embodiment. As shown, the gate electrode 422 of transistor devices 420 are provided in the first openings 425, and capacitors 430 are provided within the second openings 435.

The capacitors 430 comprise a bottom electrode 432, a dielectric layer 433, and a top electrode 434. The bottom electrode 432 and the dielectric layer 433 may have substantially U-shaped cross-sections. The top electrode 434 may have a substantially rectangular cross-section. Additionally, the capacitor 430 is fabricated without the need for additional lithography operations. As such, the capacitor 430 may be referred to as being a self-aligned structure.

Figure 5:
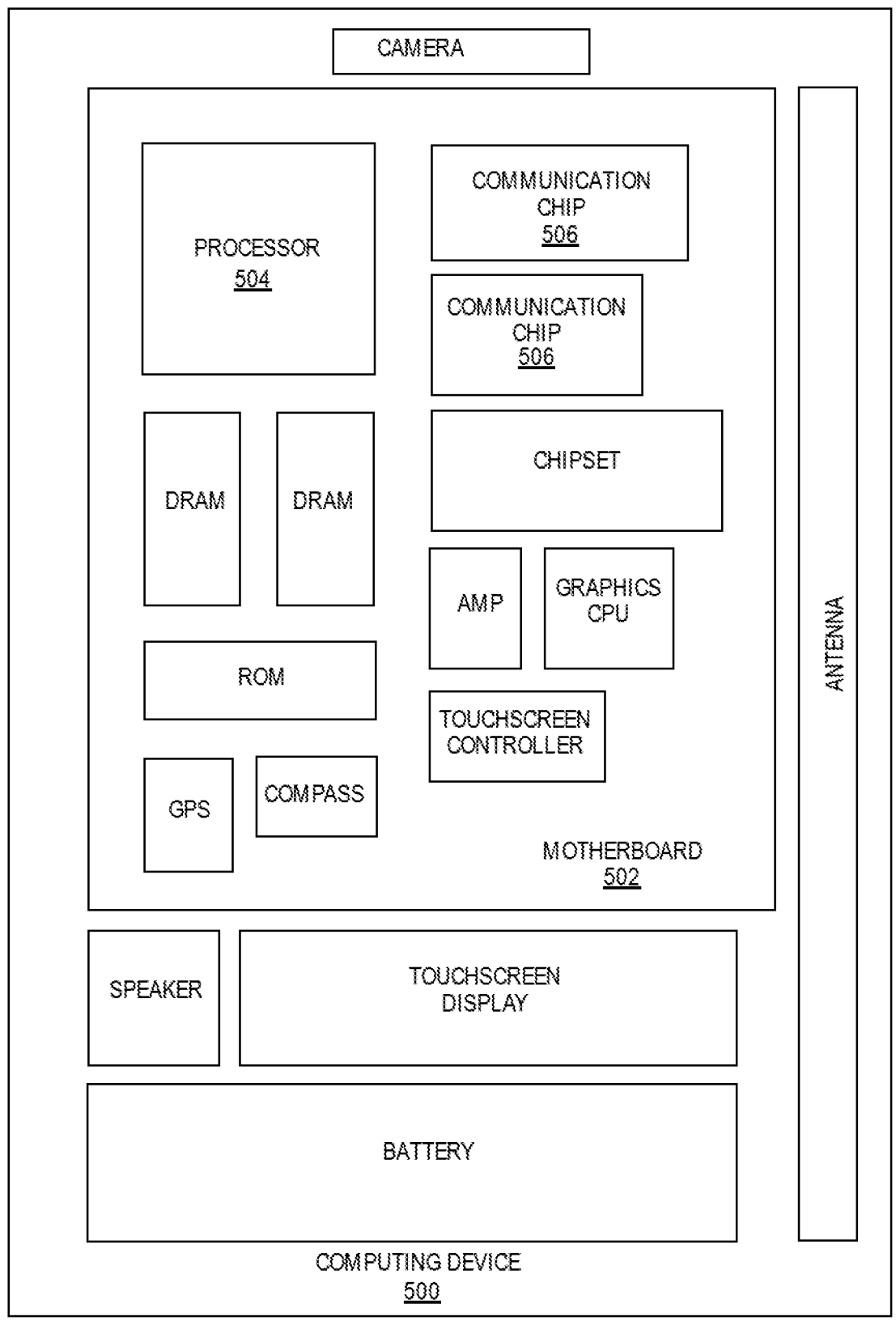
FIG. 5 illustrates a computing device in accordance with one implementation of an embodiment of the disclosure.

FIG. 5 illustrates a computing device 500 in accordance with one implementation of an embodiment of the disclosure. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In an embodiment, the integrated circuit die of the processor may comprise a self-aligned CTF memory cell and/or a self-aligned FEOL MIM capacitor, such as those described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In an embodiment, the integrated circuit die of the communication chip may comprise a self-aligned CTF memory cell and/or a self-aligned FEOL MIM capacitor, such as those described herein.

In further implementations, another component housed within the computing device 500 may comprise a self-aligned CTF memory cell and/or a self-aligned FEOL MIM capacitor, such as those described herein.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
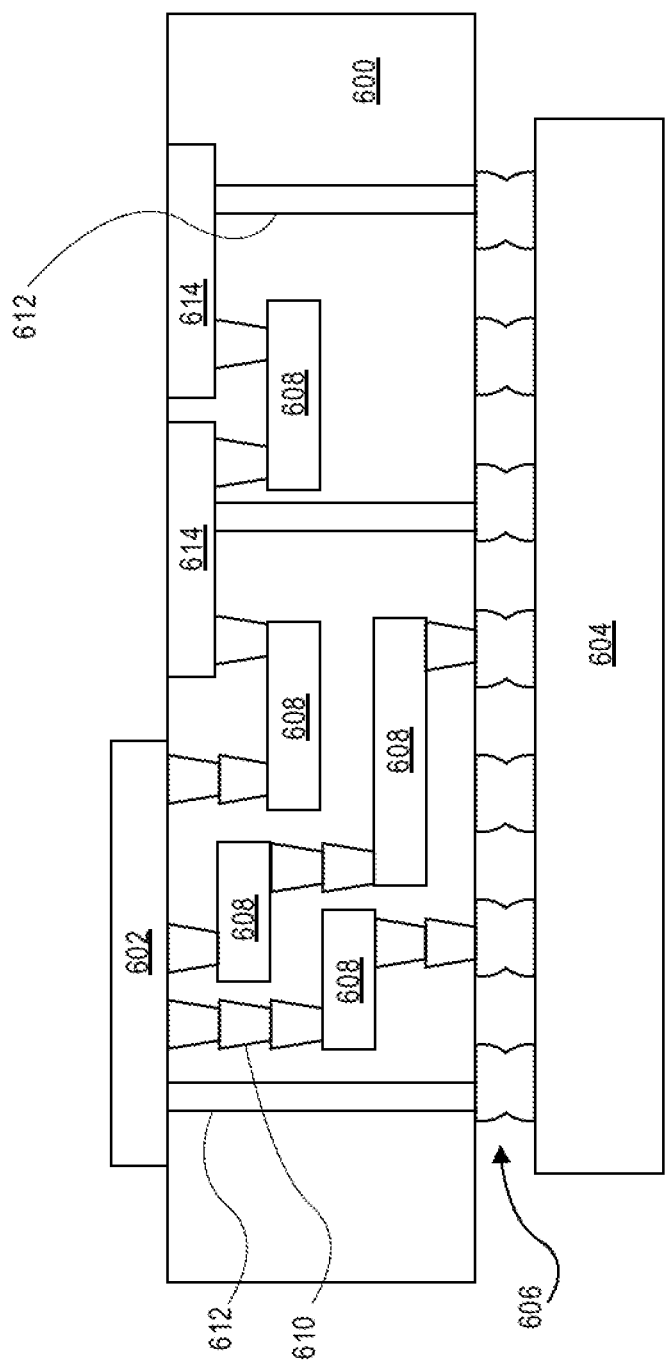
FIG. 6 is an interposer implementing one or more embodiments of the disclosure.

FIG. 6 illustrates an interposer 600 that includes one or more embodiments of the disclosure. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. In an embodiment, one of both of the first substrate 602 and the second substrate 604 may comprise a self-aligned CTF memory cell and/or a self-aligned FEOL MIM capacitor, in accordance with embodiments described herein. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer 600 may be formed of alternate rigid or flexible materials that may include the same materials described above for use in a semiconductor substrate, such as silicon, germanium, and other group III-V and group IV materials The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the disclosure, apparatuses or processes disclosed herein may be used in the fabrication of interposer 600.

Thus, embodiments of the present disclosure may comprise a self-aligned CTF memory cell and/or a self-aligned FEOL MIM capacitor, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device, comprising: a substrate; a transistor on the substrate, wherein the transistor comprises: a first gate electrode, wherein the first gate electrode is part of a first array of gate electrodes with a first pitch, wherein the first gate electrode has a first average grain size; and a component cell on the substrate, wherein the component cell comprises: a second gate electrode, wherein the second gate electrode is part of a second array of gate electrodes with a second pitch that is larger than the first pitch, wherein the second gate electrode has a second average grain size that is larger than the first average grain size.

Example 2: the semiconductor device of Example 1, wherein the component cell is a memory cell.

Example 3: the semiconductor device of Example 2, wherein the component cell is a charge trap flash memory cell.

Example 4: the semiconductor device of Example 2, wherein the component cell comprises: a tunnel barrier over the substrate; a floating electrode over the tunnel barrier; and a trap insulator over the floating electrode, wherein the second gate electrode is over the trap insulator.

Example 5: the semiconductor device of Example 4, wherein the tunnel barrier, the floating electrode, and the trap insulator have U-shaped cross-sections.

Example 6: the semiconductor device of Example 4 or Example 5, wherein the tunnel barrier is the same material as a gate dielectric between the first gate electrode and the substrate.

Example 7: the semiconductor device of Examples 4-6, wherein the floating electrode comprises a nucleation poisoned tungsten material.

Example 8: the semiconductor device of Examples 4-7, wherein the substrate comprises a fin.

Example 9: the semiconductor device of Example 8, wherein the transistor and the component cell are disposed over the fin.

Example 10: the semiconductor device of Examples 1-9, wherein the component cell is a capacitor.

Example 11: the semiconductor device of claim 10, wherein the capacitor comprises: a third electrode over the substrate; and a dielectric layer over the third electrode, and wherein the second gate electrode is over the dielectric layer.

Example 12: the semiconductor device of Example 11, wherein the third electrode is a body-shorted electrode that is electrically connected to the substrate.

Example 13: the semiconductor device of Example 11 or Example 12, wherein the third electrode comprises a nucleation poisoned tungsten material.

Example 14: a semiconductor device comprising: a semiconductor fin; a non-planar transistor over the semiconductor fin, wherein the non-planar transistor comprises: a first electrode, wherein the first electrode comprises a first average grain size; and a component cell over the semiconductor fin, wherein the component cell is a charge trap flash memory cell or a capacitor, wherein the component cell comprises: a second electrode, wherein the second electrode comprises a second average grain size that is larger than the first average grain size.

Example 15: the semiconductor device of Example 14, wherein the component cell is the charge trap flash memory cell, and wherein the component cell comprises: a tunnel barrier over the semiconductor fin; floating electrode over the tunnel barrier; a trap insulator over the floating electrode; and wherein the second electrode is over the trap insulator.

Example 16: the semiconductor device of Example 15, wherein the tunnel barrier, the floating electrode, and the trap insulator have U-shaped cross-sections.

Example 17: the semiconductor device of Examples 14-16, the component cell is the capacitor.

Example 18: the semiconductor device of Example 17, wherein the capacitor comprises: a third electrode over the semiconductor fin; and a dielectric layer over the third electrode, and wherein the second electrode is over the dielectric layer.

Example 19: the semiconductor device of Examples 14-18, wherein the first electrode is one electrode in a first array of electrodes with a first pitch, and wherein the second is electrode is one electrode in a second array of electrodes with a second pitch that is larger than the first pitch.

Example 20: a method of forming a transistor and a component cell on a semiconductor fin, comprising: forming first openings with a first pitch and second openings with a second pitch over the semiconductor fin, wherein the second pitch is larger than the first pitch; disposing a conductive nucleation layer in the first openings and the second openings; poisoning the conductive nucleation layer, wherein the poisoning suppresses subsequent growth of conductive material, wherein an entire conductive nucleation layer in the second openings is poisoned, wherein a first portion of the conductive nucleation layer at a bottom of the first openings is not poisoned, and wherein a second portion of the conductive nucleation layer at a top of the first openings is poisoned; growing a first electrode in the first openings from the first portion of the conductive nucleation layer with a deposition process at a first temperature; disposing an insulator over the first electrode and the entire conductive nucleation layer in the second openings; disposing a second electrode over the insulator with a deposition process at a second temperature that is higher than the first temperature; and recessing the first electrode and the second electrode to a height below the second portion of the conductive nucleation layer at the top of the first openings.

Example 21: the method of Example 20, wherein the first electrode has a first average grain size, and wherein the second electrode has a second average grain size that is larger than the first average grain size.

Example 22: the method of Example 20 or Example 21, wherein the first electrode is part of the transistor, and wherein the second electrode is part of the component cell.

Example 23: the method of Example 22, wherein the component cell is a charge trap flash memory cell or a capacitor.

Example 24: an electronic system, comprising: a board; a package substrate electrically coupled to the board; and a die electrically coupled to the package substrate, wherein the die comprises: a semiconductor fin; a non-planar transistor over the semiconductor fin, wherein the non-planar transistor comprises: a first electrode, wherein the first electrode comprises a first average grain size; and a component cell over the semiconductor fin, wherein the component cell is a charge trap flash memory cell or a capacitor, wherein the component cell comprises: a second electrode, wherein the second electrode comprises a second average grain size that is larger than the first average grain size.

Example 25: the electronic system of Example 24, wherein the first electrode is one electrode in a first array of electrodes with a first pitch, and wherein the second is electrode is one electrode in a second array of electrodes with a second pitch that is larger than the first pitch.

What is claimed is:

1. A semiconductor device, comprising:
   a substrate;
   a transistor on the substrate, wherein the transistor comprises:
      a first gate electrode, wherein the first gate electrode is part of a first array of gate electrodes with a first pitch, and wherein the first gate electrode has a first average grain size and a first width; and
   a component cell on the substrate, wherein the component cell comprises:
      a second gate electrode, wherein the second gate electrode is part of a second array of gate electrodes with a second pitch that is larger than the first pitch, wherein the second gate electrode has a second average grain size that is larger than the first average grain size, and wherein the second gate electrode has a second width greater than the first width of the first gate electrode.

2. The semiconductor device of claim 1, wherein the component cell is a memory cell.

3. The semiconductor device of claim 2, wherein the component cell is a charge trap flash memory cell.

4. The semiconductor device of claim 2, wherein the component cell comprises:
   a tunnel barrier over the substrate;
   a floating electrode over the tunnel barrier; and
   a trap insulator over the floating electrode, wherein the second gate electrode is over the trap insulator.

5. The semiconductor device of claim 4, wherein the tunnel barrier, the floating electrode, and the trap insulator have U-shaped cross-sections.

6. The semiconductor device of claim 4, wherein the tunnel barrier is the same material as a gate dielectric between the first gate electrode and the substrate.

7. The semiconductor device of claim 4, wherein the floating electrode comprises a nucleation poisoned tungsten material.

8. The semiconductor device of claim 1, wherein the substrate comprises a fin.

9. The semiconductor device of claim 8, wherein the transistor and the component cell are disposed over the fin.

10. A semiconductor device, comprising:
    a substrate;
    a transistor on the substrate, wherein the transistor comprises:
       a first gate electrode, wherein the first gate electrode is part of a first array of gate electrodes with a first pitch, wherein the first gate electrode has a first average grain size; and
    a component cell on the substrate, wherein the component cell comprises:
       a second gate electrode, wherein the second gate electrode is part of a second array of gate electrodes with a second pitch that is larger than the first pitch, wherein the second gate electrode has a second average grain size that is larger than the first average grain size, wherein the component cell is a memory cell, and wherein the component cell is a charge trap flash memory cell.

11. A semiconductor device, comprising:
    a substrate;
    a transistor on the substrate, wherein the transistor comprises:
       a first gate electrode, wherein the first gate electrode is part of a first array of gate electrodes with a first pitch, wherein the first gate electrode has a first average grain size; and
    a component cell on the substrate, wherein the component cell comprises:
       a second gate electrode, wherein the second gate electrode is part of a second array of gate electrodes with a second pitch that is larger than the first pitch, wherein the second gate electrode has a second average grain size that is larger than the first average grain size, wherein the component cell is a memory cell, and wherein the component cell comprises:
    a tunnel barrier over the substrate;
    a floating electrode over the tunnel barrier; and
    a trap insulator over the floating electrode, wherein the second gate electrode is over the trap insulator.

12. The semiconductor device of claim 11, wherein the tunnel barrier, the floating electrode, and the trap insulator have U-shaped cross-sections.

13. The semiconductor device of claim 11, wherein the tunnel barrier is the same material as a gate dielectric between the first gate electrode and the substrate.

14. The semiconductor device of claim 11, wherein the floating electrode comprises a nucleation poisoned tungsten material.

* * * * *